March 6, 1962 D. L. DAVIES 3,024,426

OSCILLATOR AMPLITUDE CONTROL

Filed July 15, 1959 2 Sheets-Sheet 1

INVENTOR
David L. Davies
BY
Ralph B. Stewart
ATTORNEY

March 6, 1962 D. L. DAVIES 3,024,426

OSCILLATOR AMPLITUDE CONTROL

Filed July 15, 1959 2 Sheets-Sheet 2

INVENTOR

David L. Davies

BY

Ralph B. Stewart

ATTORNEY

United States Patent Office 3,024,426
Patented Mar. 6, 1962

3,024,426
OSCILLATOR AMPLITUDE CONTROL

David Leighton Davies, Burpham, Guildford, England, assignor to The Solartron Electronic Group Limited, Ditton, Surrey, England Filed July 15, 1959, Ser. No. 827,341
Claims priority, application Great Britain July 21, 1958
6 Claims. (Cl. 331—135)

The present invention relates to electrical oscillation generators and is concerned particularly with the stabilization of the amplitude of the oscillation generated.

Although the invention has special utility in connection with oscillators of very low frequency, it is applicable to oscillators of any frequency.

For some purposes, for instance in the testing of servo systems as described in the specifiiation of United States Patent No. 2,837,718 an oscillation of highly stable amplitude and very low frequency is required: the frequency may, for example, be as low as one cycle in 24 hours. Although it is possible by known means to provide an oscillator operating at the required low frequency and with a variation of amplitude of about 1% cycle or even less, for some purposes higher stability than this is needed, for example, 1% over an indefinitely large number of cycles.

It is one of the objects of the present invention to provide means whereby the amplitude stability of such an oscillator can be further increased.

According to the present invention there is provided an oscillation generator comprising a source of electrical oscillations of sinusoidal waveform, means for sampling the voltage wave from the source over a small part of one cycle in the neighbourhood of a peak, and means for generating, and combining with the said wave, a voltage pulse having a duration short compared with the periodic time of the wave and of amplitude substantially proportional to the difference between the sampled voltage and a reference voltage, the combination being effected in such a manner as to tend to maintain the sampled amplitude constant.

Figure 1:
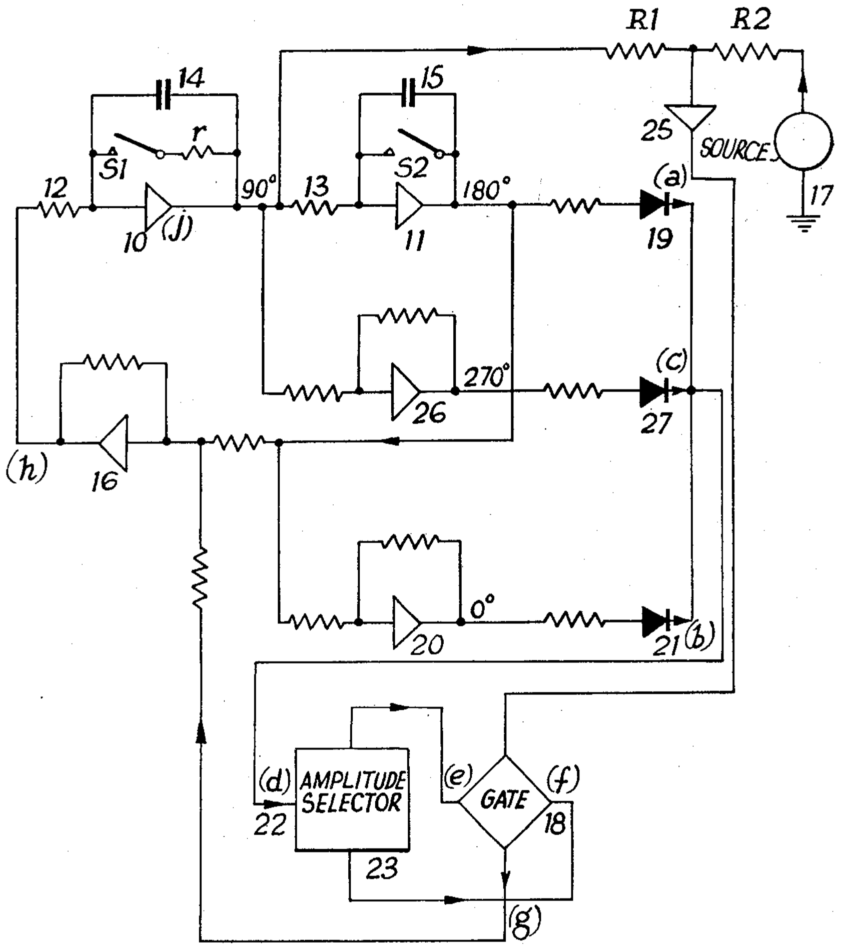

The invention will be described, by way of example, with reference to the accompanying drawings in which FIG. 1 is a block circuit diagram of one embodiment of the invention and FIGS. 2 and 3 contain voltage waveform diagrams.

Referring to FIG. 1, amplifiers 10 and 11 are arranged with series resistors 12, 13 and feed-back capacitors 14, 15 to give, each, a phase shift of nearly 90° with nearly unity gain at the frequency of oscillation required. A feed-back amplifier 16 is coupled between the output 11 and the input of 10 and is arranged to give nearly unity gain with phase reversal. The gain around the loop circuit 10, 11, 16 is positive and nearly unity and, hence, an oscillation, once established, persists with nearly constant amplitude.

It is not difficult with known circuits using high-gain amplifiers and precise components to ensure that successive cycles differ in amplitude by 1% or less. The present invention, however, as embodied in FIG. 1, enables this degree of stability to be substantially improved in the following way.

The sum of a sinusoidal voltage from the output of the amplifier 10 and a negative reference voltage from a source 17 are applied together through an amplifier 25 to a gate 18: the sum is arranged to be zero when the voltage at the output of the amplifier 10 is, in this example, 100 volts positive. The gate 18 is arranged to be opened at a positive peak of the output of the amplifier 10 in the following way: The output of the amplifier 11, which leads by 90° on that of the amplifier 10, in half-wave rectified by a diode 19 and the output of amplifier 11, reversed in sign by an amplifier 20 of negative-unity gain, is rectified by a diode 21. The full-wave rectification resulting from adding these two rectified voltages in a common lead 22 would, of course, have two nulls per cycle and to avoid this a small part of the sinusoidal voltage at the output of amplifier 10, reversed in sign by an amplifier 26 of negative-unity gain, is rectified by a diode 27 and is combined with the voltage in the common lead 22.

The resultant is applied to an amplitude selector 23 which produces a gate pulse of short width compared with the duration of a complete cycle, e.g. one hundredth of a cycle.

Figure 2:
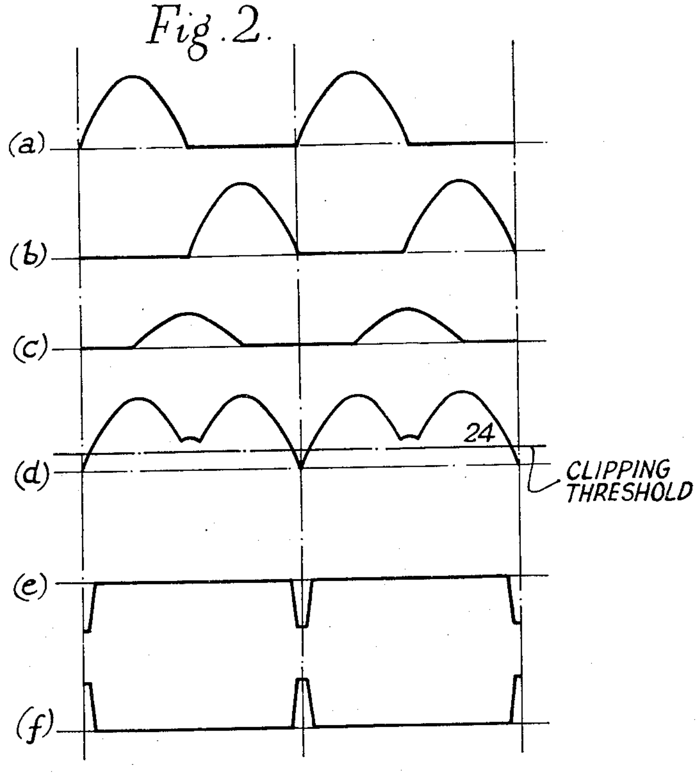

Referring to FIG. 2, the waveforms (*a*) and (*b*) appear at the outputs of diodes 19 and 21 respectively. The waveform (*c*) from the output of diode 27 combined with (*a*) and (*b*) produce at the input to the amplitude selector 23 the waveform (*d*). The amplitude selector clips at a level indicated at 24 and a clipped negative-going pulse as shown at (*e*) appears at one output of the selector 23 while a clipped positive-going pulse (*f*) appears at another output, these pulses being applied to open the gate 18.

The sum of the voltages from 10 and 17 at the time of occurrence of the pulses (*e*) and (*f*) is passed by the amplifier 25, which effects D.C. amplification and sign reversal to the gate 18 and thence to the input of the amplifier 16.

Figure 3:
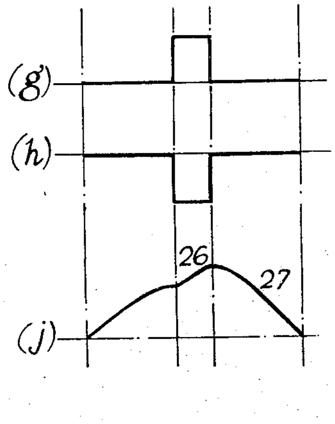

The effect of this is shown in FIG. 3. The sampling effected by the gate 18 takes place at a positive peak of the sinusoid at the output of amplifier 10 and it will be assumed that at the time of sampling the amplitude is too small, so that the sampled voltage at the output of the amplifier 25 is sufficiently negative.

The voltage at the output of the gate 18 will then be a positive-going pulse (*g*). The voltage produced by this pulse at the output of 16 will, therefore, be a negative-going pulse as shown at (*h*). The effect of this pulse on the output waveform of the amplifier 10 shown at (*j*) is to cause this output to take a ramp function upwards as indicated at 26. Thereafter, as indicated at 27, the sinusoid will continue with greater amplitude.

It will be evident that when at the time of sampling the amplitude is too great, a negative-going pulse will be generated at the output of the gate 18 and the amplitude will thereby be decreased. Obviously, also, the sampling may be arranged to take place at or near a negative peak instead of at or near a positive peak as described.

Since it may be assumed that the correction of amplitude per cycle need only be small, only a small amount of harmonic distortion arises from the correction by the ramp function. Even this small distortion may be reduced by taking the output of the generator from either or both of the outputs of the amplifiers 11 or 20, since the phase-shift amplifier 11 progressively attenuates higher harmonics in relation to the fundamental.

The invention is, of course, not limited to the use of two phase-shift amplifiers such as 10 and 11. The necessary phase shifts may be obtained, for example, from any suitable network of inductance/resistance/capacity circuits and the reversing amplifier 16 may then be arranged to give the necessary increased gain.

Moreover, the amplitude correction herein described as being applied once per cycle could of course be applied *n* times per cycle, or alternatively at every *n*th cycle where *n* is a positive integer. Correction twice per cycle may be effected by operating upon the positive peaks at the output of amplifier 10 in the manner described with reference to FIG. 1 and also upon the negative peaks of the same output. If further correction is desired the operation described may be carried out, in the same way, upon the positive and/or negative peaks of the outputs of amplifiers 20, 11, or 26, all of which are displaced in phase relatively to the output from amplifier 10. The point in the oscillator loop circuit at which the correcting voltage pulse is injected is, of course, so chosen in relation to the phase of the voltage pulse that the pulse occurs in the neighbourhood of the appropriate peak of the wave and tends to maintain the amplitude of the wave constant.

The amplitude of the oscillation is mainly determined by the ratio of $R_1$ to $R_2$ and the voltage of the source 17. For example, with −85 volts for the source and $R_1:R_2=100:85$, the voltage at the output of amplifier 10 would be 100 volts.

To ensure a constant amplitude from the commencement of oscillation a clamping arrangement is employed including as shown in FIG. 1 two switches $S_1$ and $S_2$ connected between the inputs and outputs of the amplifiers 10 and 11 respectively, a resistor *r* being connected in series with the switch $S_1$. In the clamped condition switches $S_1$ and $S_2$ are closed. The voltage at the output of amplifier 11 is then zero, whereas the voltage at the output of amplifier 10 is determined as described above mainly by $R_1R_2$ and the source 17, and is thus held at 100 volts positive in the example described. To start the oscillation, both $S_1$ and $S_2$ must be simultaneously opened.

In the particular embodiment of the invention shown in FIG. 1 what is sampled is the difference between the sinusoidal voltage from the oscillator 10, 11, 16. If desired the sinusoidal voltage from 10, 11, 16 may first be sampled by means of a gate such as 18 and the difference between the output of the gate and a reference voltage may be combined with the sinusoidal voltage from 10, 11, 16, for example by applying the difference voltage to the input of the amplifier 16.

I claim:

1. An oscillation generator comprising a source of electrical oscillations, sampling means having an input terminal, an output terminal and a sampling terminal, sampling pulse generator means generating pulses of duration short compared with the periodic time of said electrical oscillations, means coupling said source of electrical oscillations to said sampling pulse generator means and causing said sampling pulses to occur in the neighbourhood of a peak of said electrical oscillations, means coupling said sampling pulse generator means to said sampling terminal of said sampling means, means coupling said source of oscillations to said input terminal of said sampling means, whereby there are generated at said output terminal of said sampling means voltage pulses occurring in the neighbourhood of a peak of said electrical oscillations and of amplitude dependent upon the voltage of said oscillations at the instants of occurrence of said sampling pulses, and means coupling said output terminal to said source of oscillations in a sense tending to maintain said amplitude constant.

2. An oscillation generator according to claim 1, further comprising a source of constant reference voltage coupled to said sampling means, the amplitude of said voltage pulses varying in dependence upon the difference between said reference voltage and the voltage of said oscillations at the instants of occurrence of said sampling pulses.

3. An oscillation generator according to claim 2, further comprising a subtracting circuit having two inputs and an output, said source of oscillations being coupled to one of said inputs, said reference source being coupled to the other of said inputs, and said output being coupled to said sampling means.

4. An oscillation generator according to claim 1 wherein said sampling pulse generator means comprises full-wave rectifier means, phase-displacing means effecting a phase-displacement of 90°, a further rectifier means, amplitude selecting means having an input terminal and an output terminal, means coupling said source of oscillations through said full-wave rectifier means to said input terminal of said amplitude selecting means and means coupling said source of oscillations through said phase-displacing means and said further rectifier means to said input terminal, said sampling pulses being generated at said output terminal of said amplitude selecting means.

5. An oscillation generator comprising a source of electrical oscillations, a source of constant reference voltage, a subtracting circuit having two inputs and an output, means coupling said source of oscillations to one of said inputs, means coupling said reference voltage source to the other of said inputs, sampling means having an input terminal, an output terminal and a sampling terminal, sampling pulse generator means generating pulses of duration short compared with the periodic time of said electrical oscillations, means coupling said source of electrical oscillations to said sampling pulse generator means and causing said sampling pulses to occur in the neighbourhood of a peak of said electrical oscillations, means coupling said sampling pulse generator means to said sampling terminal of said said sampling means, means coupling said output of said subtracting circuit to said input terminal of said sampling means, whereby there are generated at said output terminal of said sampling means voltage pulses occurring in the neighbourhood of a peak of said electrical oscillations and of amplitude representative of the difference between the voltage of said oscillations at the instants of occurrence of said sampling pulses and said reference voltage, and means coupling said output terminal to said source of oscillations in a sense tending to maintain said amplitude constant.

6. An oscillation generator comprising an oscillatory loop circuit including amplifying and phase shifting means generating voltage waves having different phases at different points therein, at least one sampling means having an input terminal, an output terminal and a sampling terminal, sampling pulse generator means generating pulses of duration short compared with the periodic time of said waves, means coupling one of said points to said sampling pulse generator means and causing said sampling pulses to occur in the neighbourhood of a peak of the voltage wave at a given one of said points, means coupling said sampling pulse generator means to said sampling terminal of said sampling means, means coupling said given point to said input terminal of said sampling means, whereby there are generated at said output terminal of said sampling means voltage pulses occurring in the neighbourhood of a peak of said electrical oscillations and of amplitude dependent upon the voltage of the voltage wave at said given point at the instants of occurrence of said sampling pulses, and means coupling said output terminal to one of said points in said loop circuit, the pulses from said output terminal tending to maintain the amplitude of said voltage wave constant.

References Cited in the file of this patent

UNITED STATES PATENTS

| | | |
|---|---|---|
| 2,570,013 | Van Hardenberg | Oct. 2, 1951 |
| 2,912,652 | Dorney et al. | Nov. 10, 1959 |